(12) United States Patent
Odnoblyudov et al.

(10) Patent No.: US 10,290,674 B2
(45) Date of Patent: May 14, 2019

(54) ENGINEERED SUBSTRATE INCLUDING LIGHT EMITTING DIODE AND POWER CIRCUITRY

(71) Applicant: Qromis, Inc., Santa Clara, CA (US)

(72) Inventors: Vladimir Odnoblyudov, Danville, CA (US); Dilip Risbud, San Jose, CA (US); Cem Basceri, Los Gatos, CA (US)

(73) Assignee: Qromis, Inc., Santa Clara, CA (US)

( * ) Notice: Subject to any disclaimer, the term of this patent is extended or adjusted under 35 U.S.C. 154(b) by 0 days.

(21) Appl. No.: 15/491,779

(22) Filed: Apr. 19, 2017

(65) Prior Publication Data

US 2017/0309676 A1  Oct. 26, 2017

Related U.S. Application Data

(60) Provisional application No. 62/326,143, filed on Apr. 22, 2016.

(51) Int. Cl.

| *H01L 27/15* | (2006.01) |
|---|---|
| *H01L 33/00* | (2010.01) |
| *H01L 21/762* | (2006.01) |
| *H01L 27/12* | (2006.01) |
| *H01L 33/06* | (2010.01) |
| *H01L 33/32* | (2010.01) |
| *H01L 29/778* | (2006.01) |
| *H01L 29/20* | (2006.01) |
| *H01L 33/62* | (2010.01) |

(52) U.S. Cl.
CPC ........ *H01L 27/15* (2013.01); *H01L 21/76254* (2013.01); *H01L 27/1203* (2013.01); *H01L 33/007* (2013.01); *H01L 33/0075* (2013.01); *H01L 29/2003* (2013.01); *H01L 29/7787* (2013.01); *H01L 33/06* (2013.01); *H01L 33/32* (2013.01); *H01L 33/62* (2013.01); *H01L 2933/0066* (2013.01)

(58) Field of Classification Search
None
See application file for complete search history.

(56) References Cited

U.S. PATENT DOCUMENTS

| 6,323,108 | B1 | 11/2001 | Kub et al. | |
|---|---|---|---|---|
| 6,328,796 | B1 | 12/2001 | Kub et al. | |
| 6,365,429 | B1 * | 4/2002 | Kneissl | B82Y 20/00 |
| | | | | 257/E21.122 |
| 6,497,763 | B2 | 12/2002 | Kub et al. | |
| 6,593,212 | B1 | 7/2003 | Kub et al. | |
| 7,358,152 | B2 | 4/2008 | Kub et al. | |
| 7,535,100 | B2 | 5/2009 | Kub et al. | |
| 8,436,362 | B2 | 5/2013 | Park | |

(Continued)

*Primary Examiner* — Andres Munoz
(74) *Attorney, Agent, or Firm* — Kilpatrick Townsend & Stockton LLP

(57) ABSTRACT

A gallium nitride based integrated circuit architecture includes a first electronic device including a first set of III-N epitaxial layers and a second electronic device including a second set of III-N epitaxial layers. The gallium nitride based integrated circuit architecture also includes one or more interconnects between the first electronic device and the second electronic device. The first electronic device and the second electronic device are disposed in a chip scale package.

14 Claims, 12 Drawing Sheets

(56) References Cited

U.S. PATENT DOCUMENTS

| | | | |
|---|---|---|---|
| 8,476,150 B2* | 7/2013 | Jerome | H01L 21/02107 |
| | | | 257/507 |
| 8,729,563 B2 | 5/2014 | Park | |
| 9,012,253 B2 | 4/2015 | Lochtefeld et al. | |
| 9,082,692 B2 | 7/2015 | Odnoblyudov et al. | |
| 9,147,803 B2 | 9/2015 | Coursey et al. | |
| 9,166,107 B2 | 10/2015 | Park | |
| 9,269,858 B2 | 2/2016 | Schubert et al. | |
| 9,293,678 B2 | 3/2016 | Schellhammer et al. | |
| 9,997,391 B2 | 6/2018 | Odnoblyudov et al. | |
| 2009/0072267 A1* | 3/2009 | Goshonoo | H01L 27/15 |
| | | | 257/103 |
| 2009/0272975 A1* | 11/2009 | Chen | H01L 21/0237 |
| | | | 257/51 |
| 2011/0147772 A1* | 6/2011 | Lochtefeld | C30B 29/06 |
| | | | 257/94 |
| 2011/0210337 A1* | 9/2011 | Briere | H01L 21/8258 |
| | | | 257/76 |
| 2011/0260210 A1* | 10/2011 | Su | C23C 16/24 |
| | | | 257/103 |
| 2013/0320351 A1* | 12/2013 | Yang | H01L 33/36 |
| | | | 257/76 |
| 2014/0183442 A1* | 7/2014 | Odnoblyudov | H01L 33/0079 |
| | | | 257/13 |
| 2014/0183443 A1* | 7/2014 | Coursey | H01L 33/0079 |
| | | | 257/13 |
| 2017/0170232 A1 | 6/2017 | Odnoblyudov et al. | |
| 2017/0288055 A1* | 10/2017 | Aktas | H01L 27/1203 |
| 2018/0047557 A1 | 2/2018 | Odnoblyudov et al. | |
| 2018/0047618 A1 | 2/2018 | Odnoblyudov et al. | |
| 2018/0240902 A1 | 8/2018 | Odnoblyudov et al. | |

* cited by examiner

ENGINEERED SUBSTRATE INCLUDING LIGHT EMITTING DIODE AND POWER CIRCUITRY

CROSS-REFERENCES TO RELATED APPLICATIONS

This application claims priority to U.S. Provisional Patent Application No. 62/326,143, filed on Apr. 22, 2016, entitled "Light Emitting Diode and Power Circuitry Fabricated on Same Engineered Substrate," the disclosure of which is hereby incorporated by reference in its entirety for all purposes. This application is related to U.S. patent application Ser. No. 15/367,108, filed on Dec. 1, 2016, entitled "Wide Band Gap Device Integrated Circuit Architecture on Engineered Substrate, the disclosure of which is hereby incorporated by reference in its entirety for all purposes.

BACKGROUND OF THE INVENTION

Wide band gap (WBG) semiconductor devices are expensive and time consuming to manufacture. For example, gallium nitride (GaN) materials in a majority of cases are formed by a heteroepitaxial (epi) growth process where GaN is deposited on a semiconductor carrier substrate having a different lattice structure (or lattice constant) than the deposited GaN. The lattice mismatch between the GaN and the carrier substrate may create defects, dislocations, and strains that negatively impact device yields and performance.

More detrimental, the GaN layers and carrier substrate may have different coefficients of thermal expansion (CTE). Thermal processing (e.g. GaN epitaxial growth) can crack or delaminate the GaN or bow, and in some cases break, the carrier substrate. The different CTEs restrict substrate wafer size limiting scale and preventing reduction of the overall manufacturing cost of WBG devices and solutions. Therefore, despite progress in the art, there is a need for improved methods and systems related to GaN materials and devices.

SUMMARY OF THE INVENTION

The present invention relates generally to wide bandgap devices. More specifically, the present invention relates to monolithic integration of GaN-based electronic and optoelectronic devices. The methods and techniques can be applied to a variety of wide bandgap integrated circuit architectures.

According to an embodiment of the present invention, a gallium nitride based integrated circuit architecture is provided. The gallium nitride based integrated circuit architecture includes a first electronic device including a first set of III-N epitaxial layers and a second electronic device including a second set of III-N epitaxial layers. The gallium nitride based integrated circuit architecture also includes one or more interconnects between the first electronic device and the second electronic device. The first electronic device and the second electronic device are disposed in a chip scale package.

According to another embodiment of the present invention, a method of fabricating a III-nitride integrated circuit is provided. The method includes providing a engineered substrate, joining a single crystal layer to the engineered substrate, and growing a first set of III-N epitaxial layers coupled to the single crystal layer. The method also includes growing a second set of III-N epitaxial layers coupled to the first set of III-N epitaxial layers, forming a first electronic device disposed at least partially in the first set of III-N epitaxial layers, and forming a second electronic device disposed at least partially in the second set of III-N epitaxial layers. The method further includes forming one or more interconnects between the first electronic device and the second electronic device and encapsulating the first electronic device, the second electronic device, and the one or more interconnects in a chip scale package.

Numerous benefits are achieved by way of the present invention over conventional techniques. For example, embodiments of the present invention provide integrated circuits based on III-N (e.g., GaN) materials in a monolithic package. Moreover, utilizing embodiments of the present invention, increases in wafer diameter and epitaxial layer thickness are achieved that are not available using conventional techniques, thereby providing for cost reduction and improved device performance. These and other embodiments of the invention along with many of its advantages and features are described in more detail in conjunction with the text below and attached figures.

BRIEF DESCRIPTION OF THE DRAWINGS

The included drawings are for illustrative purposes and serve to provide examples of possible structures and operations for the disclosed inventive systems, apparatus, methods and devices. These drawings in no way limit any changes in form and detail that may be made by one skilled in the art without departing from the spirit and scope of the disclosed implementations.

DETAILED DESCRIPTION OF SPECIFIC EMBODIMENTS

Embodiments of the present invention relate to engineered substrate structures. More particularly, embodiments provide for the monolithic integration of multiple electronic and/or optoelectronic devices, including transistors, light emitters, and the like, in a single integrated circuit architecture utilizing gallium nitride based materials.

GaN technology is currently limited to discrete devices with no large scale integration (LSI) circuitry. Power discrete devices or modules that use GaN are typically hybrid circuits that include a GaN device fabricated on a GaN substrate co-packaged with a bipolar-CMOS-DMOS (BCD) device fabricated on a silicon substrate. For example, a depletion mode high voltage GaN HEMT is co-packaged with a low voltage silicon MOSFET to create a cascode transistor configuration. A power module may consist a co-packaged silicon based driver chip along with a GaN HEMT (or HEMTs). A problem with these hybrid power devices, in addition to the limited integration, is that the GaN device may be a normally-ON (depletion mode) device that uses a negative voltage to keep it OFF. The metal oxide semiconductor (MOS) device may use a positive power supply to switch states. Thus, two different power supplies are needed for controlling the power GaN device. This issue may be resolved by using an enhancement mode GaN HEMT which has a positive turn-on threshold voltage. However, high voltage enhancement mode GaN HEMTs are difficult to realize and thus are not widely available even in today's state of the art GaN technologies.

In the following detailed description, references are made to the accompanying drawings, which form a part of the description and in which are shown, by way of illustration, specific implementations. Although the disclosed implementations are described in sufficient detail to enable one skilled in the art to practice the implementations, it is to be understood that these examples are not limiting, such that other implementations may be used and changes may be made to the disclosed implementations without departing from their spirit and scope.

Figure 1:
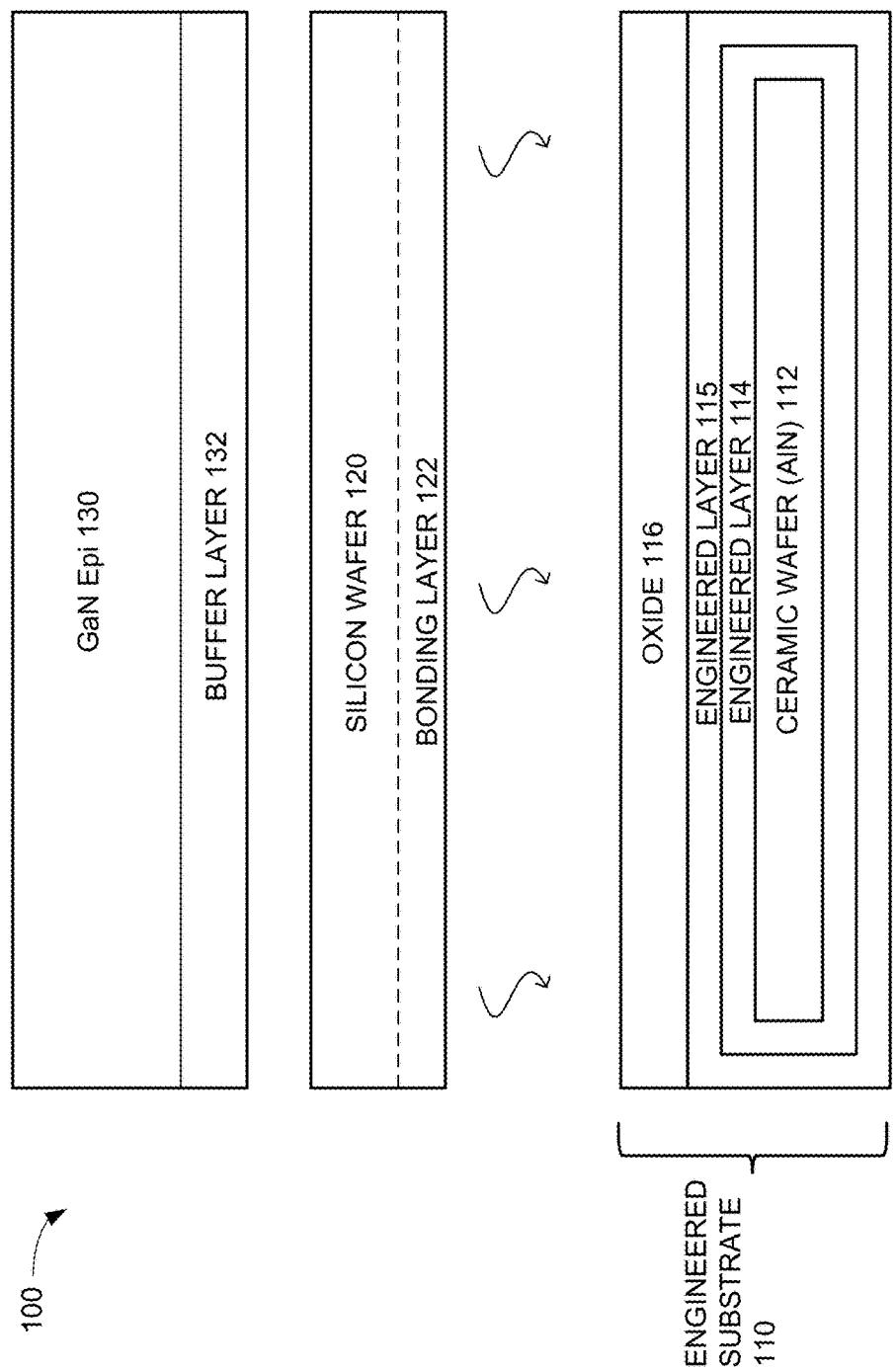
FIG. 1 shows a GaN epi formed on an engineered substrate according to an embodiment of the present invention.

FIG. 1 shows GaN epitaxial (i.e., epi) layers 130 formed on an engineered substrate (ES) 110 according to an embodiment of the present invention. Epi layers 130 can contain a single layer, multiple layers, or multiple sub-layers of a single material, or multiple sub-layers of different materials. Manufacturing of ES 110 begins with a ceramic polycrystalline wafer 112, such as aluminum nitride (AlN). Ceramic wafer 112 may comprise other polycrystalline materials, such as silicon carbide (SiC), gallium nitride (GaN), or aluminum gallium nitride (AlGaN).

A series of engineered layers 114 and 115 are deposited onto ceramic wafer 112, such as layers of oxide, nitride, and polysilicon. Engineered layers 114 and 115, which can include one or more sub-layers, provide adhesion, defectivity management, and a diffusion barrier for subsequent GaN epi layers 130. Additional description related to elements of ES 110 are provided in relation to FIG. 12. Although only two engineered layers 114 and 115 are illustrated, embodiments of the present invention are not limited to two layers and may include additional layers. An additional oxide layer 116 may be deposited on one side of ceramic wafer 112. A portion of oxide layer 116 is polished back with a chemical mechanical planarization (CMP) process to create a smooth surface for subsequent wafer bonding.

A layer transfer process is performed using a silicon wafer 120. Silicon wafer 120 is implanted with one or more elements to create a damage interface inside the silicon material, which helps form a silicon bonding layer 122, which can be a monocrystalline silicon layer for attaching to oxide layer 116. Silicon wafer 120 is atomically bonded to oxide layer 116 during the layer transfer process. In another example, an IC architecture may use a different bonding layer 122 such as, sapphire or SiC.

After the bonding process, thermal treatment activates the damage interface inside the silicon wafer, causing the implanted elements to form bubbles along the implant interface in wafer 120. These bubbles (e.g., clusters) expand and ultimately split off the top portion of silicon wafer 120 onto ceramic wafer 112 with engineered layers 114/115 and oxide layer 116.

The bonding layer 122, for example, single crystal silicon, which is bonded to oxide layer 116 is relatively thin at around less than 5 µm and therefore does not significantly contribute to the CTE properties of ES 110. CTE properties of ES 110 are therefore substantially determined by CTE coefficients of ceramic wafer 112. Materials other than silicon may be used to create bonding layer 122. These can include single crystal materials such as SiC, GaN, AlGaN, AlN, ZnO, sapphire and other.

GaN epitaxial layers (epi layers) 130 are applied on top of ES 110. Ceramic wafer 112 and epi layers 130 are substantially CTE matched over a wide temperature range (25° C.-1200° C.). This CTE matching enables formation of thicker, higher quality epi layers 130 on a larger sized ceramic wafer 112 without cracking or warping. For example, epi layers 130 may be formed on an ES 110 of various sizes including 6 inch, 8 inch, 12 inch, or larger. Fabrication of larger wafers increases device count per wafer resulting in less expensive GaN device fabrication.

CTE matching also enables formation of significantly thicker epi layers 130 (tens or hundreds of microns) on top of ES 110. The thicker combination of epi layers 130 may reduce the overall dislocation density for the lattice structures between epi layers 130 and silicon bonding layer 122. A thicker epi layer will allow a larger drift region with lower defect density, which results in higher breakdown voltage with very low leakage currents. The larger number of epi layers 130 also support more complex circuitry and more integration for a wider array of GaN applications.

Other example engineered substrates and other epi structures are described in the following U.S. patents which are hereby incorporated by reference in their entirety, U.S. Pat. Nos. 7,358,152; 7,535,100; 6,593,212; 6,497,763; 6,328, 796; 6,323,108; U.S. Ser. Nos. 12/836,970; 13/732,739; 13/223,162; 13/732,934; 12/969,302; 12/836,970; U.S. Pat. Nos. 8,436,362; 8,729,563; U.S. Ser. Nos. 14/282,406, and 15/367,108, filed on Jan. 1, 2016.

Figure 2:
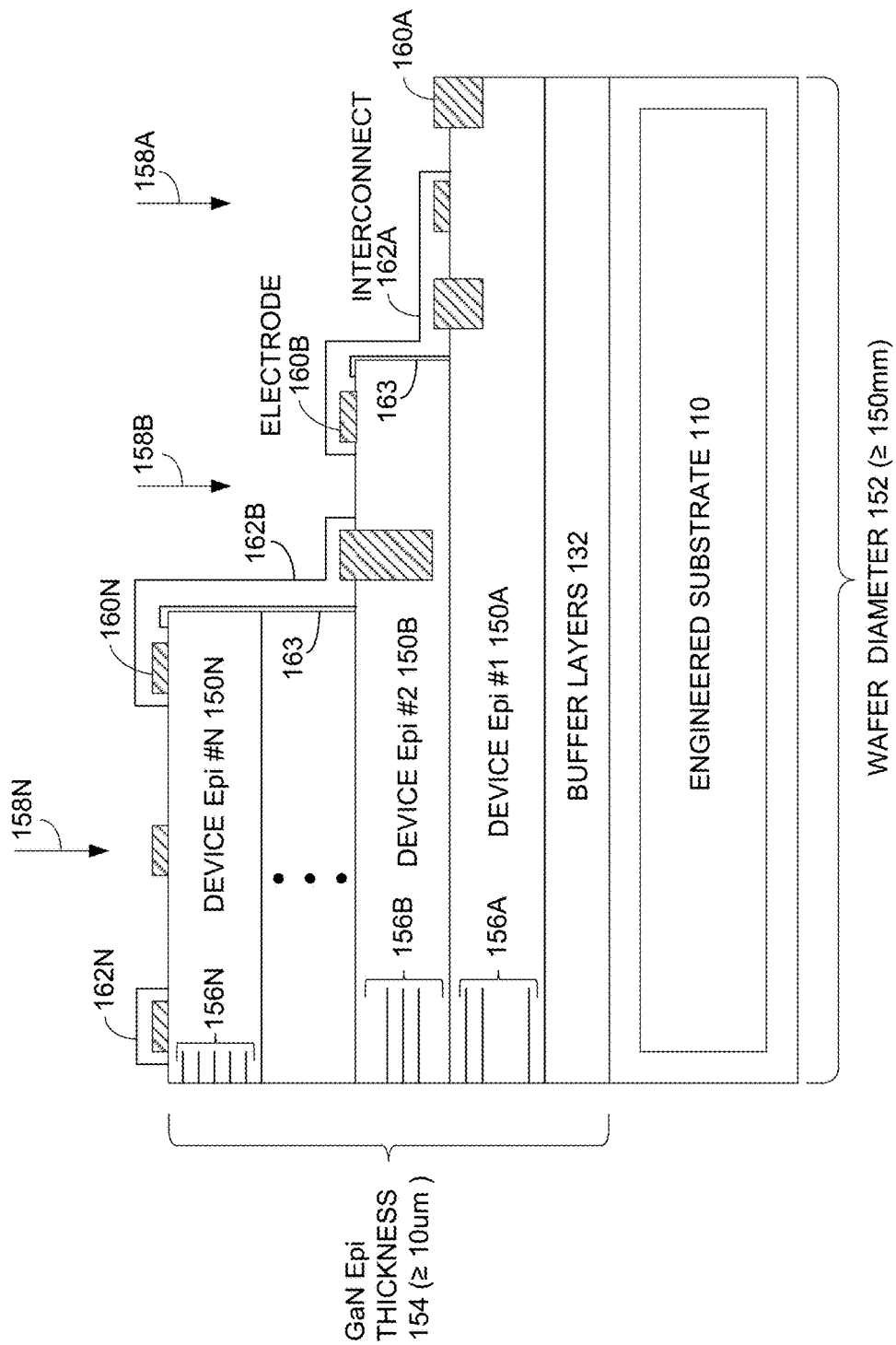
FIG. 2 shows a side sectional view of multiple GaN devices formed on the engineered substrate according to an embodiment of the present invention.

FIG. 2 shows a side sectional view of multiple GaN devices formed on the engineered substrate according to an embodiment of the present invention. As described herein, embodiments of the present invention can be referred to as GaN integrated circuit architectures. Referring to FIG. 2, one example of how multiple GaN devices are formed on engineered substrate (ES) 110 is illustrated. As explained above, CTE matching enables thicker GaN device formation on larger wafers. For example, the CTE matching enables formation of GaN devices 150 on an ES 110 with a wafer diameter 152 equal or greater than around 150 millimeter (i.e., approximately 6 inches or more). The CTE matching also enables a thicker combined GaN epi thickness 154 on ES 110 equal or greater than around 10 µm.

Larger wafer diameter 152 enables formation of more die on the same substrate. Greater GaN epi thickness 154 enables vertical formation of more devices 150 with more complex integrated circuitry on each die. Of course, wafer diameter 152 and GaN epi thickness 154 both may be larger or smaller. The combination of wafer diameter greater than 150 mm and GaN epi (not limited to GaN, but including GaN-based materials, such as InGaN, AlGaN, doped materials, other stoichiometry combinations, and the like) thickness greater than 10 µm is not available using conventional techniques, as a result, for example, of CTE mismatch between the substrate and the epitaxial layers. Using conventional techniques, including the use of sapphire substrates, the wafer diameter and epi thickness for wide bandgap materials are limited to less than 150 mm and 10 µm, respectively, because of cracking of the epi layers, and the like.

Devices 150A-150N are each formed with one or more groups of GaN epi layers 156. For example, epi layers 156A for GaN device 150A are applied on top of buffer layer 132. Epi layers 156B for GaN device 150B are applied on top of epi layers 156A for GaN device 150A. Any number of additional epi layers 156N for any number of additional GaN devices up to GaN device 150N are formed on top of epi layers 156A and 156B. The vertical integration of the epi layers and the devices formed therein, enables the monolithic integration of multiple different devices in a single integrated circuit architecture. As described herein, these devices can include electronic devices including diodes, transistors, unipolar devices, bipolar devices, and the like, as well as optoelectronic devices including light emitting diodes, lasers, detectors, phase modulators, waveguides, and the like. Lateral interconnects can be utilized to connect one or more devices to form integrated circuits. One of ordinary skill in the art would recognize many variations, modifications, and alternatives.

After formation of epi layers 156, a first etching process 158A etches down to epi layers 156A for GaN device 150A. For example, a mask may be located over left and center portions of epi layers 156. A chemical, vapor, or laser etching process 158A etches through epi layers 156N-156B down to epi layers 156A.

A set of mesas, interconnects, and electrodes 160A are then formed on one or more of epi layers 156A. For example, mesas and interconnects may extend down to one or more GaN epi layers 156A. Electrodes 160A are then formed on the interconnects configuring GaN epi layers 156A into device 150A.

A second etching stage 158B may etch down to epi layers 156B for GaN device 150B. For example, a mask may be located over left and right lateral portions of epi layers 156. A wet etch or dry etch processes are used to etch through epi layers 156N down to epi layers 156B. A second set of mesas, interconnects, and electrodes 160B configure GaN epi layers 156B into GaN device 150B. Etching stages 158 are repeated for each group of epi layers 156 forming different devices 150.

Interconnects 162 are formed in between or after etching stages 158. A mask is placed over areas where no interconnects 162 are desired. Interconnects 162 are then formed over the exposed surfaces interconnecting electrodes 160. For example, interconnect 162A connects some of electrodes 160A for GaN device 150A with some of electrodes 160B for GaN device 150B.

In the same or in a different process, interconnect 162B is formed on top of devices 150B and 150N and connects some of electrodes 160B for device 150B with some of electrodes 160N for device 150N. In the same or in a different process, interconnect 162N connects other electrodes 160N on device 150N with electrodes on other devices 150. Another process may form insulation layers 163 underneath interconnects 162A and 162B to electrically isolate the different devices 150.

Each group of epi layers 156 may form any type of unipolar or bipolar GaN devices 150 with any combination of n-doped or p-doped regions. Epi layers 156 may form any combination of electronic devices, optoelectronic devices, power devices, and/or RF devices.

An alternative N device epi structure deploys a "selective epi" process as an alternative to post epi etching processes 158A, 158B and 158N. In the selective epi approach, after deposition of epi #1 device 150A, the surface of the wafer is masked with an organized pattern to prevent subsequent GaN deposition on the masked areas.

After masking, epi #2 device 150B is deposited. Masked areas on the surface of epi #1 device do not receive any deposition of epi #2 device. This iterative selective epi process may be repeated N times to create the mesa structure shown in FIG. 2. Electrodes 160, insulation layers 163, interconnects 162 are formed after completion of the iterative selective epi process in some embodiments.

Figure 3:
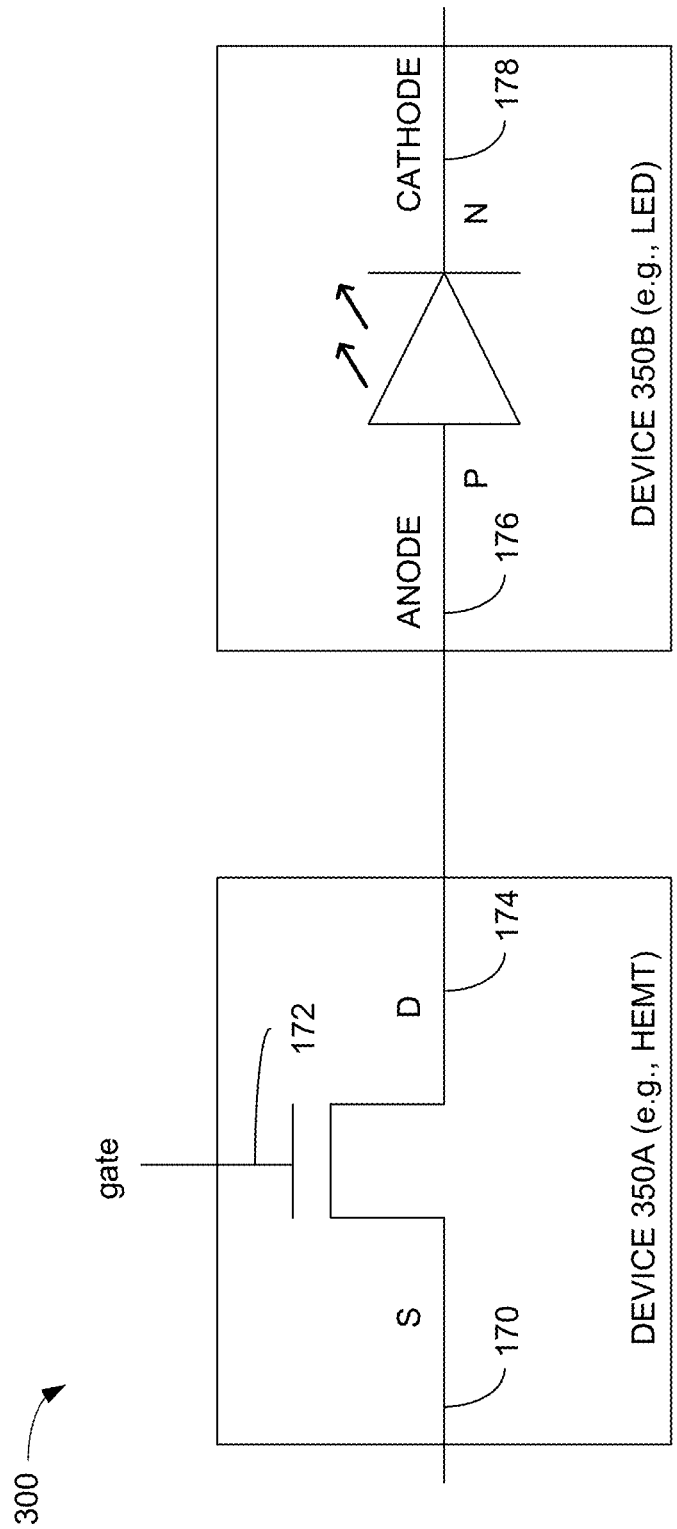
FIG. 3 shows an example integrated circuit formed on the same engineered substrate according to an embodiment of the present invention.

FIG. 3 shows an example integrated circuit formed on the an engineered substrate according to an embodiment of the present invention. As illustrated in FIG. 3, one example IC 300 is formed using epi layers similar to those shown in FIG. 2. In this example, epi layers for device 350A form a wide band gap (WBG) high electron mobility field effect transistor (HEMT) and epi layers for device 350B form a light emitting diode (LED). Device 350A, illustrated as a transistor, includes a source 170, a gate 172, and a drain 174. Device 350B, illustrated as an LED, includes an n-doped cathode 178 and a p-doped anode 176, which is interconnected to drain 174 of device 350A. Although device 350A is illustrated as a HEMT in FIG. 3, embodiments of the present invention are not limited to this particular electronic device and other electronic and optoelectronic devices can be utilized according to embodiments of the present invention. Moreover, although FIG. 3 illustrates device 350B as an LED device, embodiments of the present invention are not limited to this particular optoelectronic device and other electronic and optoelectronic devices can be utilized according to embodiments of the present invention. Examples include other types of transistors, lasers, photodetectors, and the like.

Figure 4:
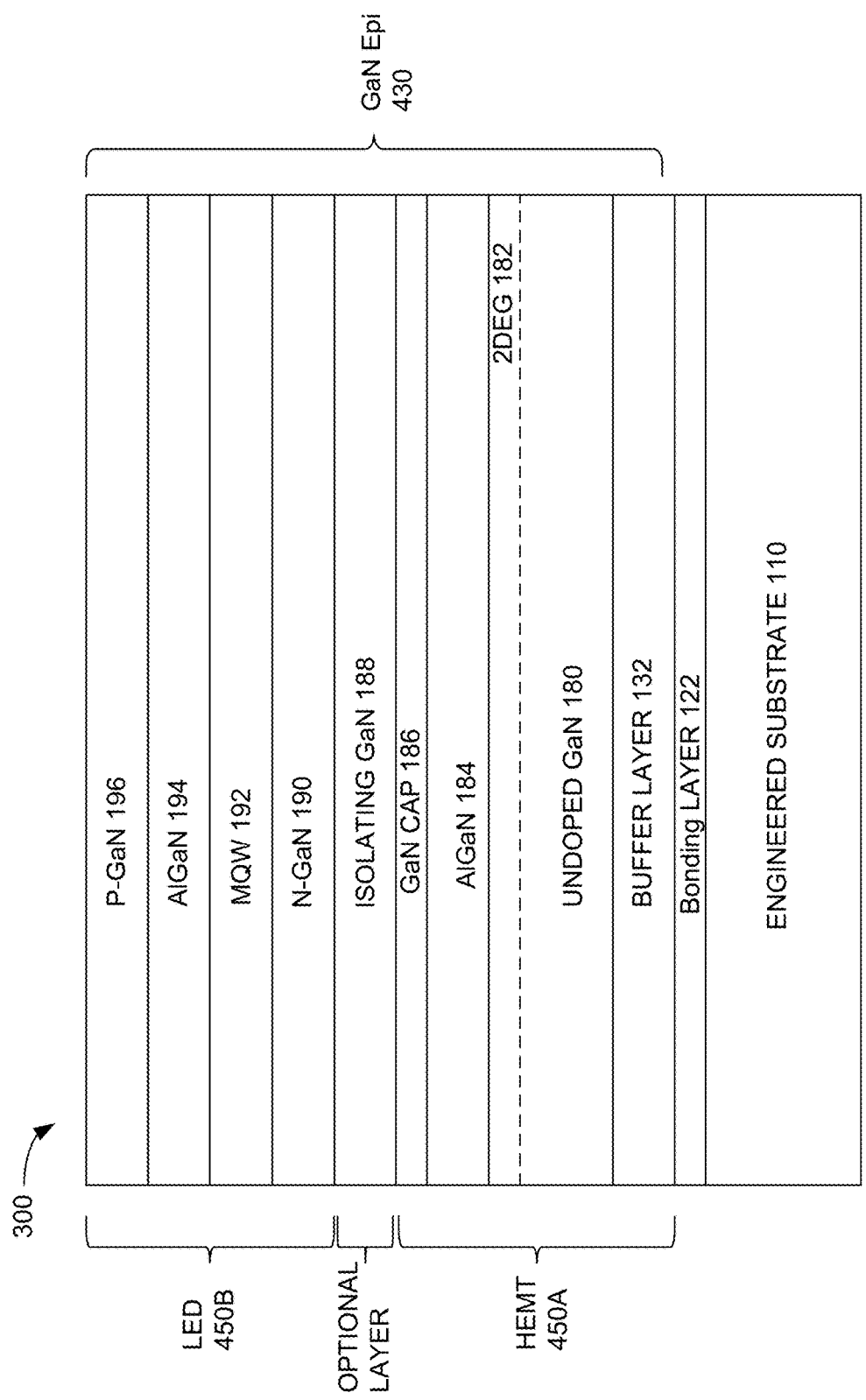
FIG. 4 shows different GaN layers used for fabrication of different GaN devices according to an embodiment of the present invention.

FIG. 4 shows different GaN layers used for fabrication of different GaN devices according to an embodiment of the present invention. Referring to FIG. 4, an example GaN epitaxial structure 430, which can be utilized in forming IC 300 in FIG. 3, is illustrated. Again, this is just one example and other architectures also may be used to form HEMT device 450A and LED device 450B.

A typical LED GaN epitaxial structure 430 for HEMT device 450A may include an undoped GaN layer 180 formed over buffer layer 132. Aluminum gallium nitride (AlGaN) layer 184 is deposited onto GaN layer 180. Two dimensional electron gas (2DEG) 182 is formed under AlGaN layer 184 as result of polarization-induced conduction band bending. A GaN cap layer 186 provides a protective layer over AlGaN layer 184. In some embodiments, the GaN cap layer 186 serves to protect AlGaN layer 184 from adverse effects of the growth process used to grow subsequent epitaxial layers. After subsequent growth, portions or all of the GaN cap layer 186 can be removed to access epitaxial layers disposed below the GaN cap layer 186, including AlGaN layer 184. The GaN cap layer 186 can be p-type, for example, used in an enhancement mode device. In other embodiments, the GaN cap layer can be heavily doped to provide an ohmic contact.

An optional isolating GaN layer 188 is applied over GaN cap layer 186 providing electrical isolation between HEMT device 450A and LED device 450B. As an example, isolating GaN layer 188 can prevent current injection from n-type GaN layer 190 into the underlying HEMT. Isolating GaN layer 188 also may provide protection against over etching when exposing HEMT device 450A.

GaN epi layers for LED device 450B are formed on top of the GaN epi layers for HEMT device 450A. An n-type GaN layer 190 is formed on isolating GaN layer 188. An active region with multiple layers of GaN and indium gallium nitride (InGaN) forms a multiple quantum well (MQW) region 192. A next operation may apply an aluminum gallium nitride (AlGaN) current blocking layer 194 on top of MQW region 192 and then apply a p-type GaN layer 196 on AlGaN layer 194.

Applying a voltage across n-type and p-type GaN layers 190 and 196, respectively, injects carriers into MQW region 192 causing light emission. In one example, the GaN epi layers forming HEMT device 450A and LED device 450B are each up to approximately 5-6 µm thick. The combination of p-type GaN layer 196, AlGaN layer 194, and MQW region 192 is approximately 0.5 µm thick.

Figure 12:
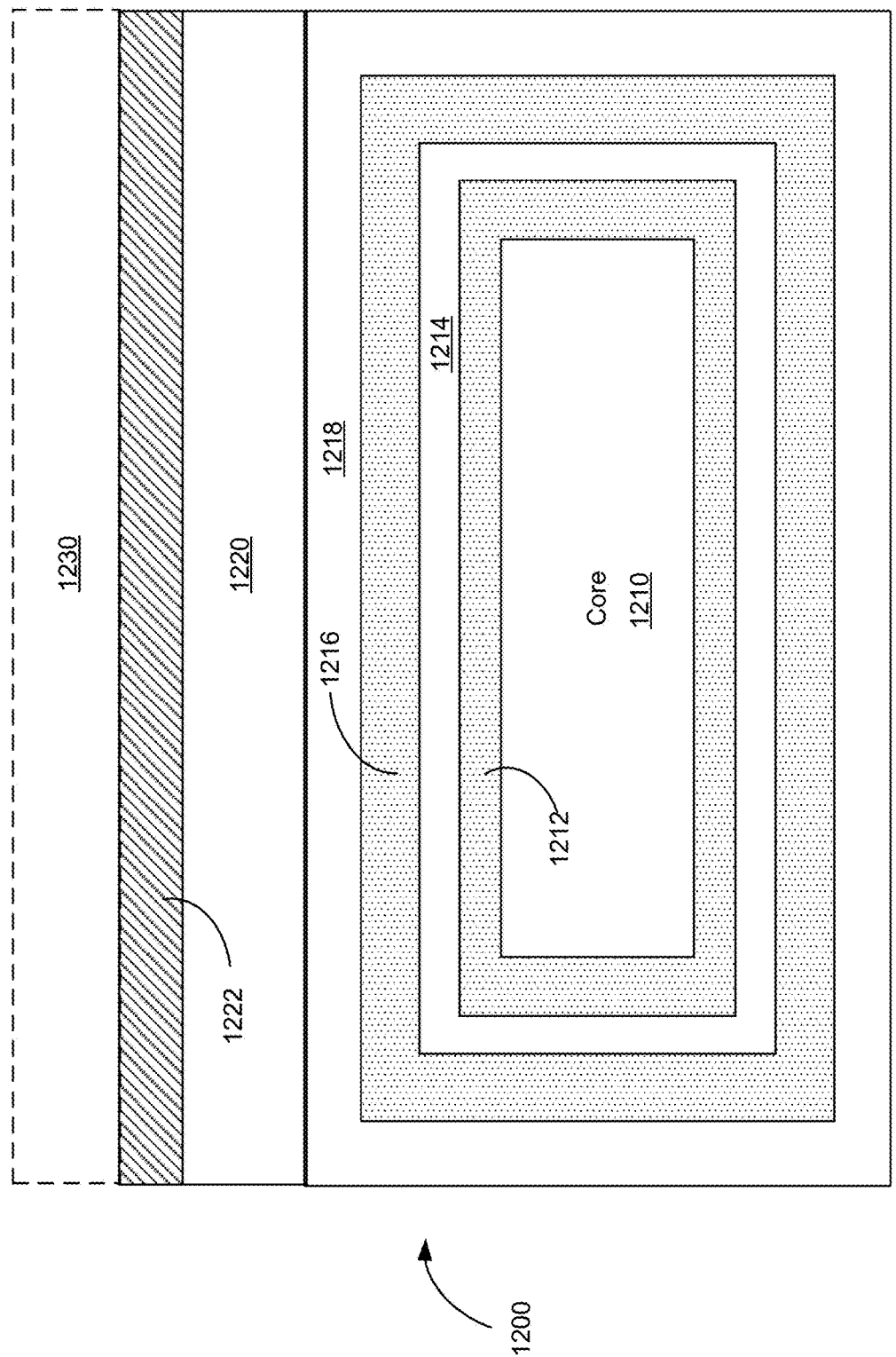
FIG. 12 is a simplified schematic diagram illustrating an engineered substrate structure, according to an embodiment of the present invention.

FIG. 12 is a simplified schematic diagram illustrating an engineered substrate structure, according to an embodiment of the present invention. ES 1200 illustrated in FIG. 12 is suitable for a variety of electronic and optical applications. ES 1200 includes a core 1210 that can have a coefficient of thermal expansion (CTE) that is substantially matched to the CTE of the epitaxial material that will be grown on ES 1200. A GaN epitaxial layer 1230 is illustrated as optional because it is not required as an element of ES 1200, but will typically be grown on ES 1200.

For applications including the growth of gallium nitride (GaN)-based materials (epitaxial layers including GaN-based layers), core 1210 can be a polycrystalline ceramic material, for example, polycrystalline aluminum nitride (AlN), which may include binding agents, such as yttrium oxide. Other materials can be utilized as core 1210, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide ($Ga_2O_3$), and the like. The thickness of core 1210 can be on the order of 100 to 1,500 µm, for example, 750 µm.

Core 1210 may be encapsulated in a first adhesion layer 1212 that can be referred to as a shell or an encapsulating shell. In an embodiment, first adhesion layer 1212 comprises a tetraethyl orthosilicate (TEOS) oxide layer on the order of 1,000 Å in thickness. In other embodiments, the thickness of first adhesion layer 1212 varies, for example, from 100 Å to 2,000 Å. Although TEOS oxides can be utilized for adhesion layers in some embodiments, other materials that provide for adhesion between later deposited layers and underlying layers or materials (e.g., ceramics, in particular, polycrystalline ceramics) can be utilized according to other embodiments of the present invention. For example, $SiO_2$ or other silicon oxides ($Si_xO_y$) may adhere well to ceramic materials and may provide a suitable surface for subsequent deposition, for example, of conductive materials. In some embodiments, first adhesion layer 1212 completely surrounds core 1210 in some embodiments to form a fully encapsulated core and can be formed using an LPCVD process or other suitable deposition processes, which can be compatible with semiconductor processing, and in particular, with polycrystalline or composite substrates and layers. In some embodiments, first adhesion layer 1212 may be formed on one side of core 1210. First adhesion layer 1212 provides a surface on which subsequent layers adhere to form elements of the engineered substrate structure.

In addition to the use of LPCVD processes, spin on glass/dielectrics, furnace-based processes, and the like, to form the encapsulating adhesion layer, other semiconductor processes can be utilized according to embodiments of the present invention, including CVD processes or similar deposition processes. As an example, a deposition process that coats a portion of the core can be utilized; the core can be flipped over, and the deposition process could be repeated to coat additional portions of the core. Thus, although LPCVD techniques are utilized in some embodiments to provide a fully encapsulated structure, other film formation techniques can be utilized, depending on the particular application.

A conductive layer 1214 is formed on first adhesion layer 1212. In an embodiment, conductive layer 1214 is a shell of polysilicon (i.e., polycrystalline silicon) that is formed surrounding first adhesion layer 1212 since polysilicon can exhibit poor adhesion to ceramic materials. In embodiments in which conductive layer 1214 is polysilicon, the thickness of the polysilicon layer can be on the order of 500-5,000 Å, for example, 2,500 Å. In some embodiments, the polysilicon layer can be formed as a shell to completely surround first adhesion layer 1212 (e.g., a TEOS oxide layer), thereby forming a fully encapsulated adhesion layer, and can be formed using an LPCVD process. In other embodiments, the conductive material can be formed on a portion of the adhesion layer, for example, an upper half of the substrate structure. In some embodiments, the conductive material can be formed as a fully encapsulating layer and can be subsequently removed on one side of the substrate structure.

In an embodiment, conductive layer 1214 can be a polysilicon layer doped to provide a highly conductive material. for example, conductive layer 1214 may be doped with boron to provide a p-type polysilicon layer. In some embodiments, the doping with boron is at a level of $1 \times 10^{19}$ $cm^{-3}$ to $1 \times 10^{20}$ $cm^{-3}$ to provide for high conductivity. Other dopants at different dopant concentrations (e.g., phosphorus, arsenic, bismuth, or the like at dopant concentrations ranging from $1 \times 10^{16}$ $cm^{-3}$ to $5 \times 10^{18}$ $cm^{-3}$) can be utilized to provide either n-type or p-type semiconductor materials suitable for use in the conductive layer. One of ordinary skill in the art would recognize many variations, modifications, and alternatives.

The presence of conductive layer 1214 is useful during electrostatic chucking of the engineered substrate to semiconductor processing tools, for example tools with electrostatic chucks (e-chucks or ESC). Conductive layer 1214 enables rapid dechucking after processing in the semiconductor processing tools. In embodiments of the present invention, the conductive layer enables electrical contact with the chuck or capacitive coupling to the e-chuck during future processing including bonding. Thus, embodiments of the present invention provide substrate structures that can be processed in manners utilized with conventional silicon wafers. One of ordinary skill in the art would recognize many variations, modifications, and alternatives. Additionally, having a substrate structure with high thermal conductivity in combination with electrostatic chucking may provide better deposition conditions for the subsequent formation of engineered layers and epitaxial layers, as well as for the subsequent device fabrication steps. For example, it may provide desirable thermal profiles that can result in lower stress, more uniform deposition thicknesses, and better stoichiometry control through the subsequent layer formations.

A second adhesion layer 1216 (e.g., a TEOS oxide layer on the order of 1,000 Å in thickness) is formed on conductive layer 1214. Second adhesion layer 1216 completely surrounds conductive layer 1214 in some embodiments to form a fully encapsulated structure and can be formed using an LPCVD process, a CVD process, or any other suitable deposition process, including the deposition of a spin-on dielectric.

A barrier layer 1218, for example, a silicon nitride layer, is formed on second adhesion layer 1216. In an embodiment, barrier layer 1218 is a silicon nitride layer that is on the order of 4,000 Å to 5,000 Å in thickness. Barrier layer 1218 completely surrounds the second adhesion layer in some embodiments to form a fully encapsulated structure and can be formed using an LPCVD process. In addition to silicon nitride layers, amorphous materials including SiCN, SiON, AlN, SiC, and the like can be utilized as the barrier layers. In some implementations, barrier layer 1218 includes a number of sub-layers that are built up to form barrier layer 1218. Thus, the term barrier layer is not intended to denote a single layer or a single material, but is to encompass one or more materials layered in a composite manner. One of ordinary skill in the art would recognize many variations, modifications, and alternatives.

In some embodiments, barrier layer 1218, e.g., a silicon nitride layer, prevents diffusion and/or outgassing of elements present in the core, for example, yttrium (elemental), yttrium oxide (i.e., yttria), oxygen, metallic impurities, other trace elements, and the like, into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN, that are designed for non-clean room environments, can be utilized in semiconductor process flows and clean room environments.

In some embodiments, ceramic materials utilized to form the core may be fired at temperatures in the range of 1,800° C. It would be expected that this process would drive out a significant amount of impurities present in the ceramic materials. These impurities can include yttrium, which results from the use of yttria as sintering agent, calcium, and other elements and compounds. Subsequently, during epitaxial growth processes, which may be conducted at much lower temperatures in the range of 800° C. to 1,100° C., it would be expected that the subsequent diffusion of these impurities would be insignificant. However, contrary to conventional expectations, even during epitaxial growth processes at temperatures much lower than the firing temperature of the ceramic materials, significant diffusion of elements through the layers of the engineered substrate may be present. Thus, embodiments of the present invention integrate the barrier layer into the engineered substrate structure to prevent this undesirable diffusion.

Thus, embodiments of the present invention integrate a silicon nitride layer to prevent out-diffusion of the background elements from the polycrystalline ceramic material (e.g., AlN) into the engineered layers and epitaxial layers such as an optional GaN epitaxial layer 1230. The silicon nitride layer encapsulating the underlying layers and material provides the desired barrier layer 1218 functionality. The integration of the silicon nitride layer into the engineered substrate structure prevents the diffusion of calcium, yttrium, and aluminum into the engineered layers during the annealing process that occurred when the silicon nitride layer was not present. Thus, the use of the silicon nitride layer as the barrier layer 1218 prevents these elements from diffusing through the diffusion barrier and thereby prevents their release into the environment surrounding the engineered substrate. Similarly, any other impurities containing within the bulk ceramic material would be contained by the barrier layer.

A bonding layer 1220 (e.g., a silicon oxide layer) may be deposited on a portion of barrier layer 1218, for example, on the top surface of barrier layer 1218, and subsequently used during the bonding of a substantially single crystal layer 1222 (e.g., a single crystal silicon layer such as exfoliated silicon (111) layer). Bonding layer 1220 can be approximately 1.5 µm in thickness in some embodiments. In some embodiments, the thickness of bonding layer 1220 is 20 nm or more for bond-induced void mitigation. In some embodiments, the thickness of bonding layer 1220 is in the range of 0.75-1.5 µm.

Bonding layer 1220 can be formed by a deposition of a thick (e.g., 2-5 µm thick) oxide layer followed by a chemical mechanical polishing (CMP) process to thin the oxide to approximately 1.5 µm or less in thickness. The thick initial oxide serves to smooth surface features present on the support structure that may remain after fabrication of the polycrystalline core and continue to be present as the encapsulating layers illustrated in FIG. 1 are formed. The CMP process provides a substantially planar surface free of voids, which can then be used during a wafer transfer process to bond single crystal layer 1222 to bonding layer 1220.

The substantially single crystal layer 1222 (e.g., exfoliated Si (111)) is suitable for use as a growth layer during an epitaxial growth process for the formation of epitaxial materials. In some embodiments, the epitaxial material can include a GaN layer of 2 µm to 10 µm in thickness, which can be utilized as one of a plurality of layers utilized in optoelectronic, RF, and power devices. In an embodiment, substantially single crystal layer 1222 includes a single crystal silicon layer that is attached to the bonding layer using a layer transfer process.

A layer transfer process may be performed using a silicon wafer. The silicon wafer may be implanted with several elements to create a damage interface inside Si, which may help to form single crystal layer 1222 for attaching to bonding layer 1220. For example, applying pressure on the silicon wafer and bonding layer 1220 that are attached together may atomically bond the silicon wafer to bonding layer 1220.

After the bonding process, an exfoliation process may activate the damage interface inside the silicon wafer and cause the implanted elements in single crystal layer 1222 to expand, thus splitting the top portion of the silicon wafer from ceramic core 1210 with engineered layers. Remaining single crystal layer 1222 bonded to bonding layer 1220 may be relatively thin, such as less than around 5 microns, and therefore may not significantly contribute to the CTE of ES 1200. The CTE of ES 1200 is therefore primarily determined by the CTE of ceramic core 1210.

Materials other than silicon may be used to create a single crystal thin bonding layer. These single crystal materials may include SiC, GaN, AlGaN, AlN, ZnO, sapphire, and other.

GaN epitaxial layer 1230 (which may also be referred to as epitaxial layers) can be formed by epitaxially growing a number of layers or sub-layers to form an epitaxial structure on top of ES 1200. As used herein, the term "layer" should be understood to include a structure including multiple layers or sub-layers of the same or different materials. In some embodiments, a buffer layer may be formed on bonding layer 1220, and GaN epitaxial layer 1230 (epitaxial layers) may be formed on top of the buffer layer. The CTEs of ceramic core 1210 and GaN epitaxial layer 1230 may be substantially matched over a wide temperature range (e.g., from about 25° C. to about 1200° C.), such as within about 0.1%, 0.5%, 1%, 2%, 5%, or 10% of each other. This CTE matching enables the formation of higher quality epitaxial layers on larger ceramic wafers without cracking or warping. For example, GaN epitaxial layer 1230 may be formed on an ES 1200 of 6-inch, 8-inch, 12-inch, or larger. Using larger wafers may increase the device count per wafer and thus result in less expensive GaN devices.

The CTE matching may also enable the formation of a significantly thicker GaN epitaxial layer 1230 (e.g., tens or hundreds of microns) on top of ES 1200. The combined epitaxial layers may reduce the overall dislocation density of the lattice structures between GaN epitaxial layer 1230 and single crystal layer 1222. In addition, a larger number of epitaxial layers can be used to fabricate more complex circuity for a wider array of GaN devices.

Additional description related to engineered substrates is provided in U.S. Provisional Patent Application Nos. 62/350,077, filed on Jun. 14, 2016, and 62/354,623, filed on Jun. 24, 2016, and 62/461,722, filed on Feb. 21, 2017, the disclosures of which are hereby incorporated by reference in their entirety for all purposes.

According to an embodiment of the present invention, an epitaxial structure is provided. The epitaxial structure includes an engineered substrate and a single crystal layer joined to the engineered substrate. The engineered substrate can include a polycrystalline ceramic core, a first tetraethyl orthosilicate (TEOS) layer encapsulating the polycrystalline ceramic core, a polysilicon layer encapsulating the first TEOS layer, a second TEOS layer encapsulating the polysilicon layer, and a silicon nitride layer encapsulating the second TEOS layer. The epitaxial structure also includes a first set of III-N epitaxial layers coupled to the single crystal layer and a second set of III-N epitaxial layers coupled to the first set of III-N epitaxial layers.

As an example, the first set of III-N epitaxial layers comprise GaN and the second set of III-N epitaxial layers can include GaN. In some embodiments, the diameter of the engineered substrate is greater than 150 mm and the combined thickness of the first set of III-N epitaxial layers and the second set of III-N epitaxial layers is greater than 10 μm. One or more isolating III-N epitaxial layers can be disposed between the first set of III-N epitaxial layers and the second set of III-N epitaxial layers. Additionally, one or more buffer layers can be disposed between the single crystal layer and the first set of III-N epitaxial layers.

The epitaxial structure can include III-N epitaxial layers that are suitable for implementation of a transistor and additional III-N epitaxial layers includes layers that are suitable for implementation of a light emitter.

Figure 5:
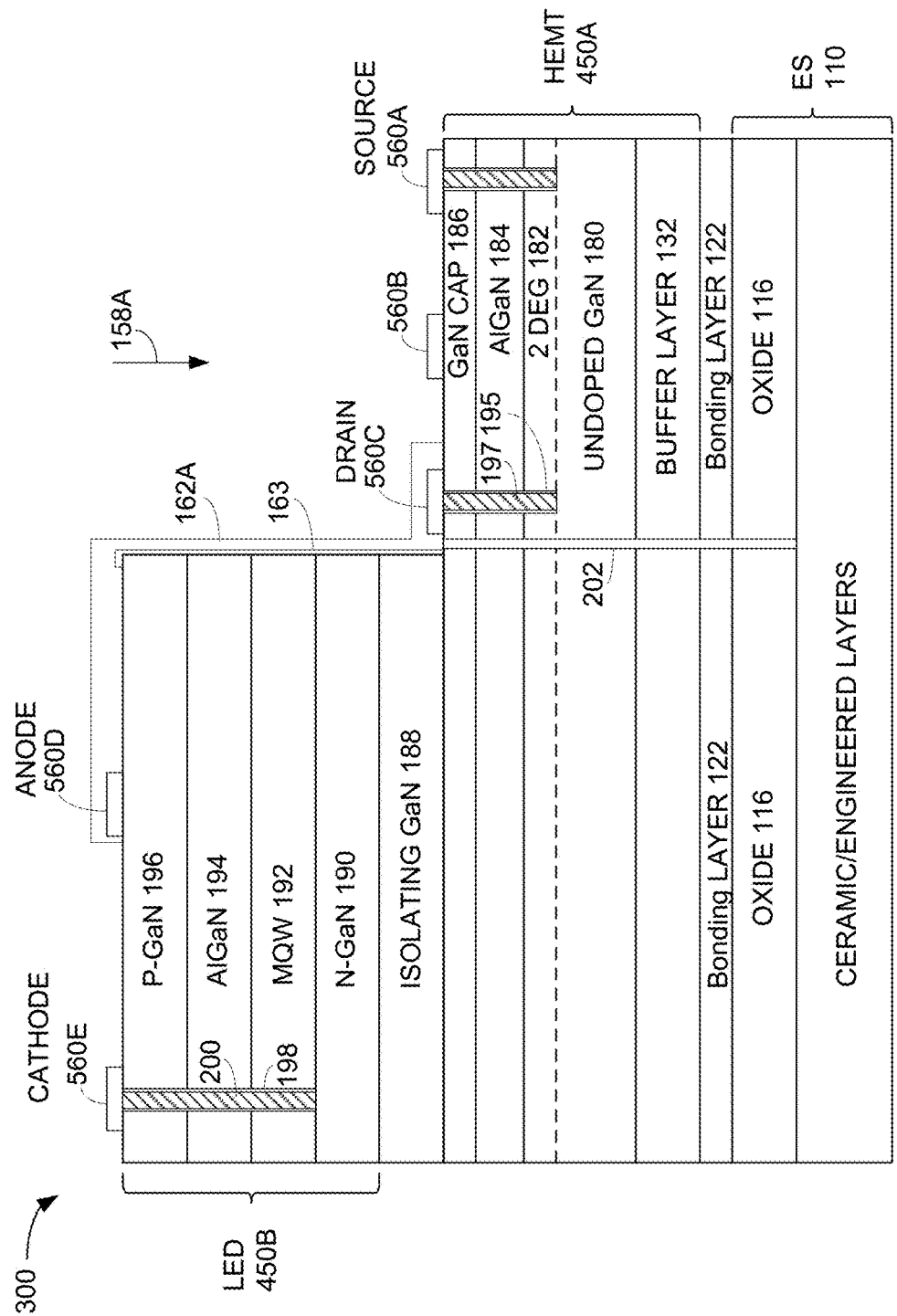
FIG. 5 shows different GaN devices formed in the different GaN layers according to an embodiment of the present invention.

FIG. 5 shows different GaN devices formed in the different GaN layers according to an embodiment of the present invention.

FIG. 5 shows a next fabrication stage for IC 300. The next stage may locate a hard mask over a left lateral section of IC 300. Etching process 158A etches through the right lateral section of LED device 450B down to GaN cap layer 186. Mesas 195 are etched down to undoped GaN layer 180 and buried contacts 197 are formed in mesas 195.

A next processing operation may etch a mesa 202, also referred to as a trench, vertically down to ES 110 between HEMT device 450A and LED device 450B. A dielectric material may fill and cover mesa 202 providing lateral electrical isolation between HEMT device 450A and LED device 450B. In some embodiments, mesa 202 is optional. In addition to electrical isolation, mesa 202 can provide lateral separation between devices in some embodiments. A next process may form a source electrode 560A and a drain electrode 560C on buried contacts 197 and form a gate electrode 560B on GaN cap layer 186.

Based on the type of HEMT device (enhancement or depletion mode), the processing operation may etch other mesas and form another buried contacts underneath gate electrode 560B down to AlGaN layer 184. Additional dielectric layers may be disposed between gate electrode 560B and GaN cap layer 186 to form a MISHEMT-type device.

A next processing operation may etch mesa 198 down to n-type GaN layer 190 of LED device 450B and form buried n-contact 200 in mesa 198. Processing operations form n-electrode 560E on buried n-contact 200 and form p-electrode 560D on p-type GaN layer 196. Sidewalls of mesa 198 are covered with insulating material, such as silicone oxide.

Processing may form p-contact interconnects on top of p-type GaN layer 196 connecting via routing layers to p-electrode 560D. P-electrode 560D may be transparent or highly reflective, depending on final device architecture chosen for LED device 450B.

A next processing operation may form interconnect 162A over electrodes 560C and 560D connecting the drain of HEMT device 450A to the p-electrode 560D of LED device 450B. A processing operation also may form insulation layers 163 prior to forming interconnect 162A.

Figure 6:
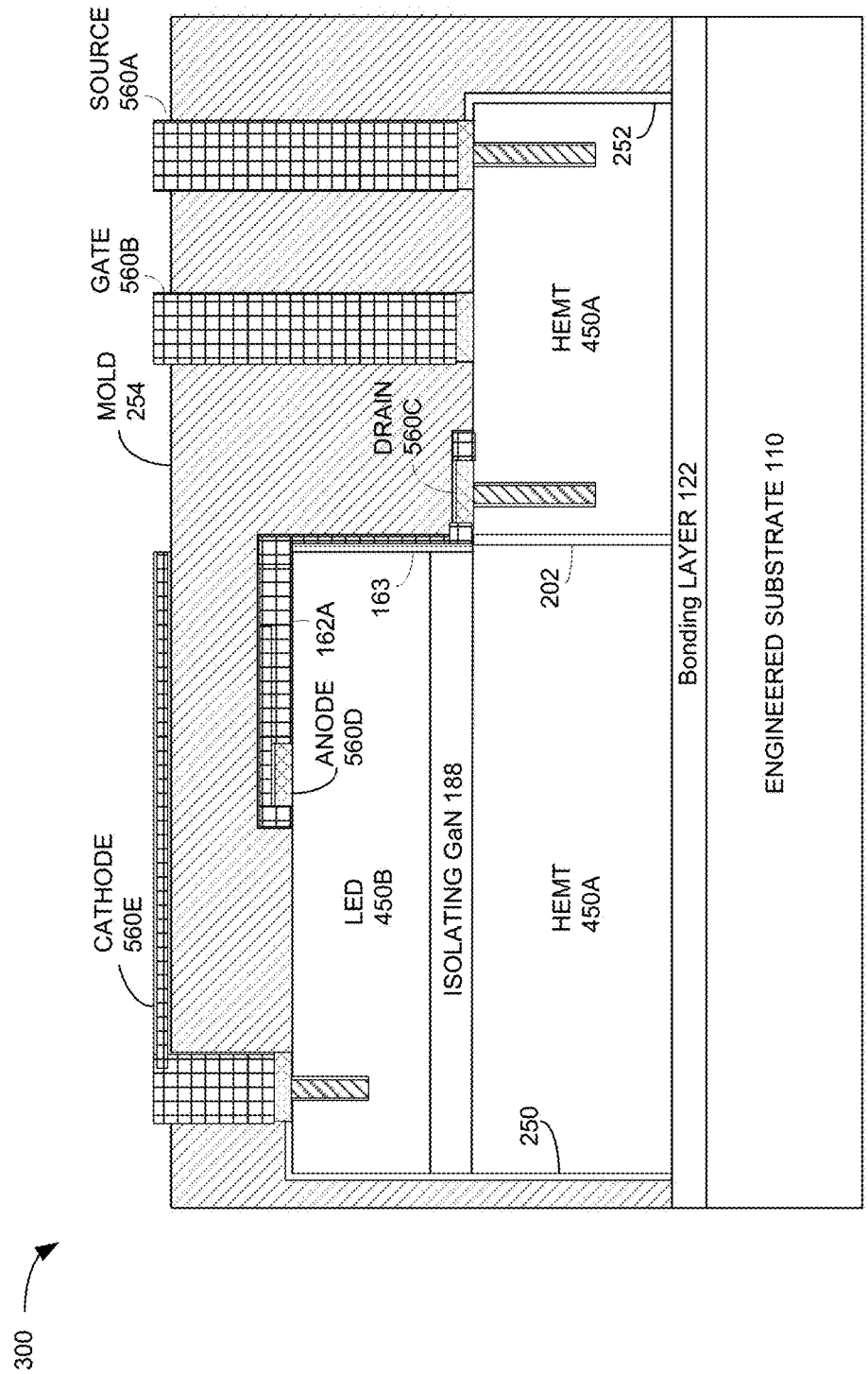
FIG. 6 shows a GaN solid state integrated circuit (IC) formed on an engineered substrate according to an embodiment of the present invention.

FIG. 6 shows a GaN solid state integrated circuit (IC) formed on an engineered substrate according to an embodiment of the present invention.

FIG. 6 shows in more detail a side sectional view of IC 300 that includes HEMT device 450A and LED device 450B formed on ES 110. Sidewall mesas 250 and 252 are etched down to bonding layer 122, for example, through an n-type GaN layer, and are covered with a dielectric material to provide electrical isolation from other circuitry formed on the same ES 110. In one example, source electrode 560A, gate electrode 560B, and cathode/ground n-electrode 560E may be built up in height with copper plating to around 50-100 μm. Thus, the ohmic contacts to the device terminals can be fabricated using different metals than those that are used to form the electrodes.

A molding material 254 is applied around electrodes 560 and over interconnect 162A. In one example, molding material 254 is an epoxy molding compound (EMC), or sheet molding compound (SMC). The epoxy is initially viscous and then heated and pressed until solidifying into solid structural support around electrodes 560. A resin can also be used to provide for mechanical support and electrical insulation in some embodiments.

A polishing process is typically used for grinding ES 110 off of HEMT device 450A. However, the grinding process may take a substantial amount of time and destroy ES 110. The cost of fabricating IC 300 increases since new ES 110 is used for each wafer. The grinding process also applies stress to HEMT device 450A. In one example, a lift off process is used to separate ES 110 from HEMT device 450A as described in U.S. patent application Ser. No. 15/288,506, filed on Oct. 7, 2016, which is hereby incorporated by reference in its entirety for all purposes.

Figure 7:
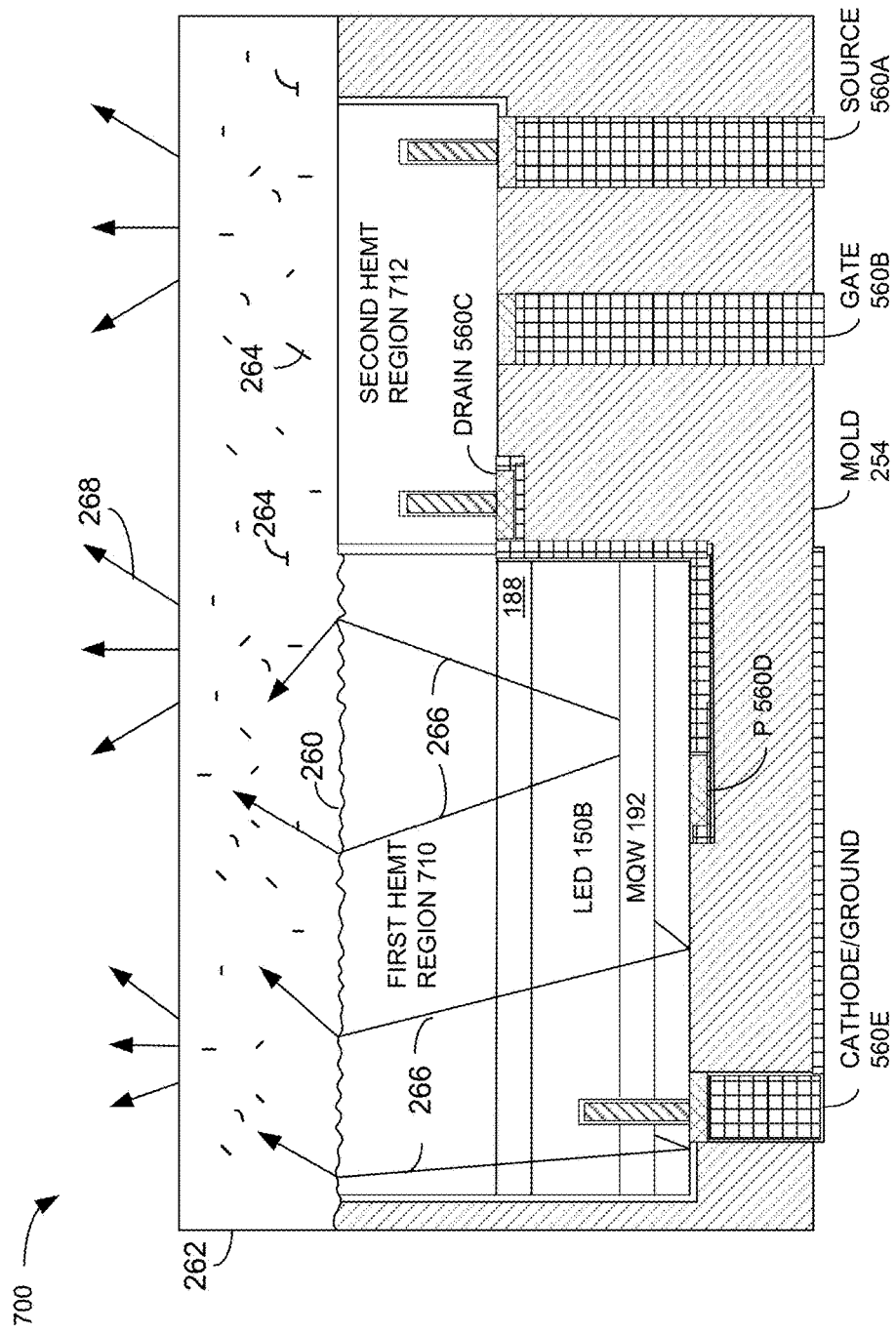
FIG. 7 shows the GaN IC of FIG. 6 after removal of the engineered substrate, and subsequent processing steps according to an embodiment of the present invention.

FIG. 7 shows the GaN IC of FIG. 6 after removal of the engineered substrate, and subsequent processing steps according to an embodiment of the present invention. The diagram in FIG. 7 is associated with the process steps that are performed after ES 110 is removed from the IC 300 illustrated in FIG. 6. An upper surface 260 of a first HEMT region 710 of HEMT device 450A is roughened to increase light extraction. Although a second HEMT region 712 of HEMT device 450A is not roughened in the embodiment illustrated in FIG. 7, this second HEMT region 712 can be roughed in other embodiments. Although the surface of the first HEMT region 710 and the second HEMT region 712 are illustrated as substantially coplanar, this is not required by the present invention and in some embodiments, the roughening of the first HEMT region 710 results in removal of material such that the thickness of the first HEMT region 710 is less than the thickness of the second HEMT region 712, thereby reducing an optical absorption occurring in the first HEMT region 710. A layer of an encapsulant, for example, transparent silicone, 262 is applied on top of HEMT device 450A and hardened for additional structural support. The encapsulant (e.g., silicone) layer 262 may contain a phosphor material 264 that can absorb light emitted by the LED and emit light of a longer wavelength. Thus, in this embodiment, an emission structure is formed that includes the transparent material (e.g., silicone) and a phosphor. The emission structure is placed adjacent the first electronic device and the second electronic device so that is can absorb light produced by one or more of the electronic devices and then emit light, for example, of a different color. In one example, layers in HEMT device 450A and isolating GaN layer 188 may be transparent and electrodes 560 may be reflective.

To operate IC 700, a voltage is applied to gate electrode 560B of HEMT device 450A. The HEMT acts as a switch for the LED connecting its drain electrode 560C to the p-electrode 560D (Anode) of LED device 450B. The voltage on p-electrode 560D excites electrons in MQW region 192 generating light 266. Light 266 may exit directly out into encapsulant (e.g., silicone) layer 262 formed on inverted HEMT device 450A, and/or reflect off of electrodes, 560C and 560D and back out through encapsulant (e.g., silicone) layer 262. Light 266 may excite phosphor material 264 in the encapsulant (e.g., silicone) layer 262 converting into a longer wavelength (e.g., yellow) light that results in an output from IC 700 of white light 268.

It will be appreciated that the device area occupied by the HEMT used to drive the LED will be a small fraction (e.g., ~5-10%) of the total area occupied by the integrated circuit architecture. Accordingly, the second HEMT region 712 may be much smaller than the first HEMT region 710.

Figure 8:
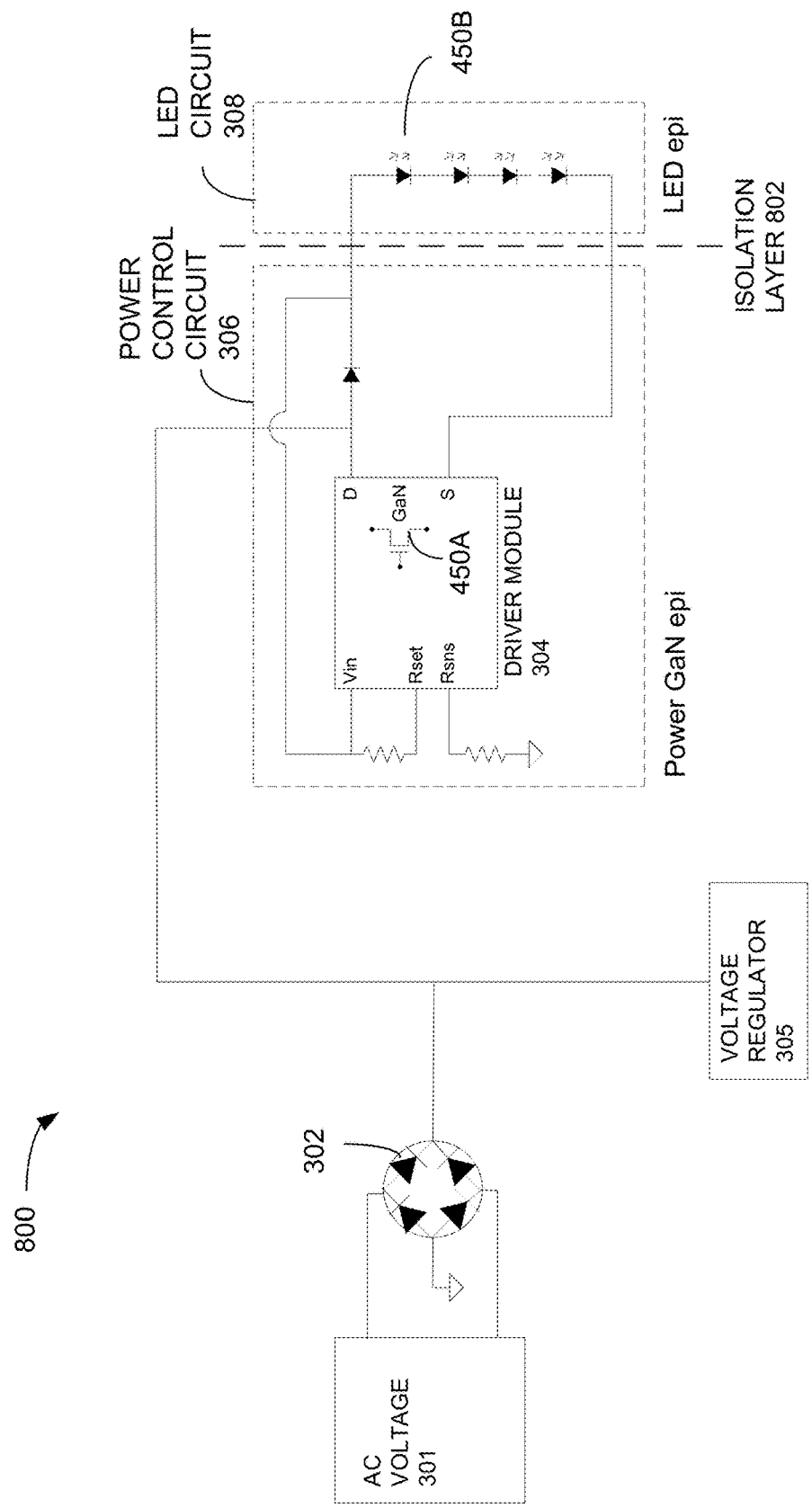
FIG. 8 shows a direct power light emitting diode (LED) circuit fabricated using an engineered substrate according to an embodiment of the present invention.

FIG. 8 shows a direct power light emitting diode (LED) circuit fabricated using an engineered substrate according to an embodiment of the present invention. Referring to FIGS. 6-8, a direct power LED circuit 800 can include circuitry for a power control circuit 306 and LED circuit 308 may be formed on the same ES 110. For example, multiple GaN HEMT devices similar to HEMT device 450A may be formed laterally and/or vertically adjacent to each other on ES 110 and interconnected through different interconnection layers and associated contacts as described above.

Multiple LED devices similar to LED device 450B in LED circuit 308 also may be formed laterally and/or vertically adjacent to each other on other portions of ES 110 and interconnected together and to power control circuit 306 through other interconnection layers and associated contacts as described above. In the illustrated embodiment, four LED devices, each device being an LED device 450B, are connected in series and may be fabricated in the same set of epitaxial layers (i.e., LED epi) and spatially separated laterally. Of course, other numbers of LEDs can be connected in series, for example, 8 or 16 LEDs, thereby increasing the voltage that is applied across the LEDs connected in series. As will be evident, driving the LEDs (which may be multi junction LEDs) at higher voltage can improve the efficiency of the drive electronics. Isolation layers 802, or other well formations, may electrically isolate HEMT device 450A in power control circuit 306 and LED device 450B in LED circuit 308.

HEMT device 450A and LED device 450B also may form a rectifier bridge circuit 302 and voltage regulator 305. Rectifier bridge circuit 302 converts AC voltage 301 into a regulated positive voltage. Voltage regulator 305 controls a voltage level on the input of LED circuit 308 and driver module 304 provides a substantially constant current source for driving LED devices 450B.

Figure 9:
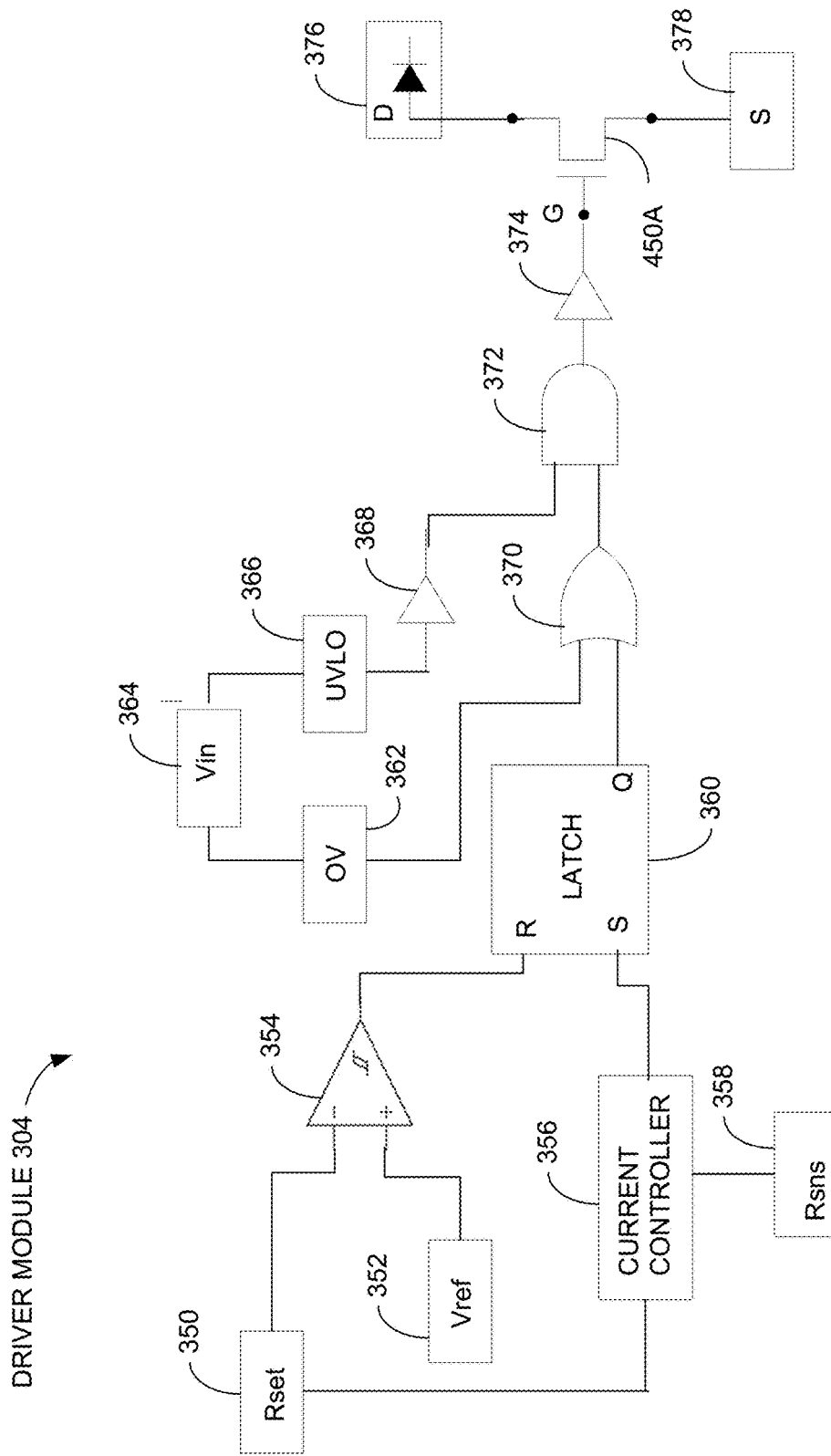
FIG. 9 shows a driver module used in the direct power LED circuit of FIG. 8 in more detail.

FIG. 9 shows a driver module 304 used in the direct power LED circuit of FIG. 8 in more detail. Rset pin 350 connects to a first input of a comparator 354 and a Vref voltage 352 is connected to the second input of comparator 354. A current controller 356 is connected to both Rset pin 350 and Rsns pin 358. A latch 360 includes a reset input connected to the output of comparator 354 and a set input connected to the output of current controller 356.

An OR gate 370 includes a first input connected to the output of latch 360 and a second input is connected to an overvoltage (OV) Circuit 362. Vin pin 364 is connected between OV circuit 362 and undervoltage (UVLO) circuit 366. OV circuit 362 senses an overvoltage condition, especially transient voltage spikes and quickly disconnects the input voltage supply from the load before any damage can occur to the rest of the circuit and the LED. In a simple form, OV circuit 362 may consist of just three devices—a voltage regulator diode, a fast thyristor and a resistor. If the output voltage exceeds the limit set by the voltage regulator, the thyristor will conduct. The voltage across the resistor will rise, the thyristor will switch on and the power rails are short circuited. The duration of the short circuit is very short in which the voltage is greatly reduced, thus protecting the circuit. A more sophisticated OV circuit 362 may consist of a precise voltage reference ($V_{ref}$), a comparator with hysteresis and control logic.

UVLO circuit 366 senses the input voltage Vin when it drops below a specified threshold level and disables (or locks out) the circuit via a control signal when the comparator trips. Configurable hysteresis through positive feedback enables a clean lockout in the presence of noise. Built-in hysteresis also ensures that the device does not turn off intermittently near the threshold as the input voltage starts increasing.

An AND gate 372 includes a first input connected through a driver 368 to an output of UVLO circuit 366 and a second input connected to the output of OR gate 370. The gate of HEMT device 450A is connected through a driver 374 to the output of AND gate 372. The drain 376 and source 378 of HEMT device 450A are connected to opposite ends of LED circuit 308 in FIG. 8.

Figure 10:
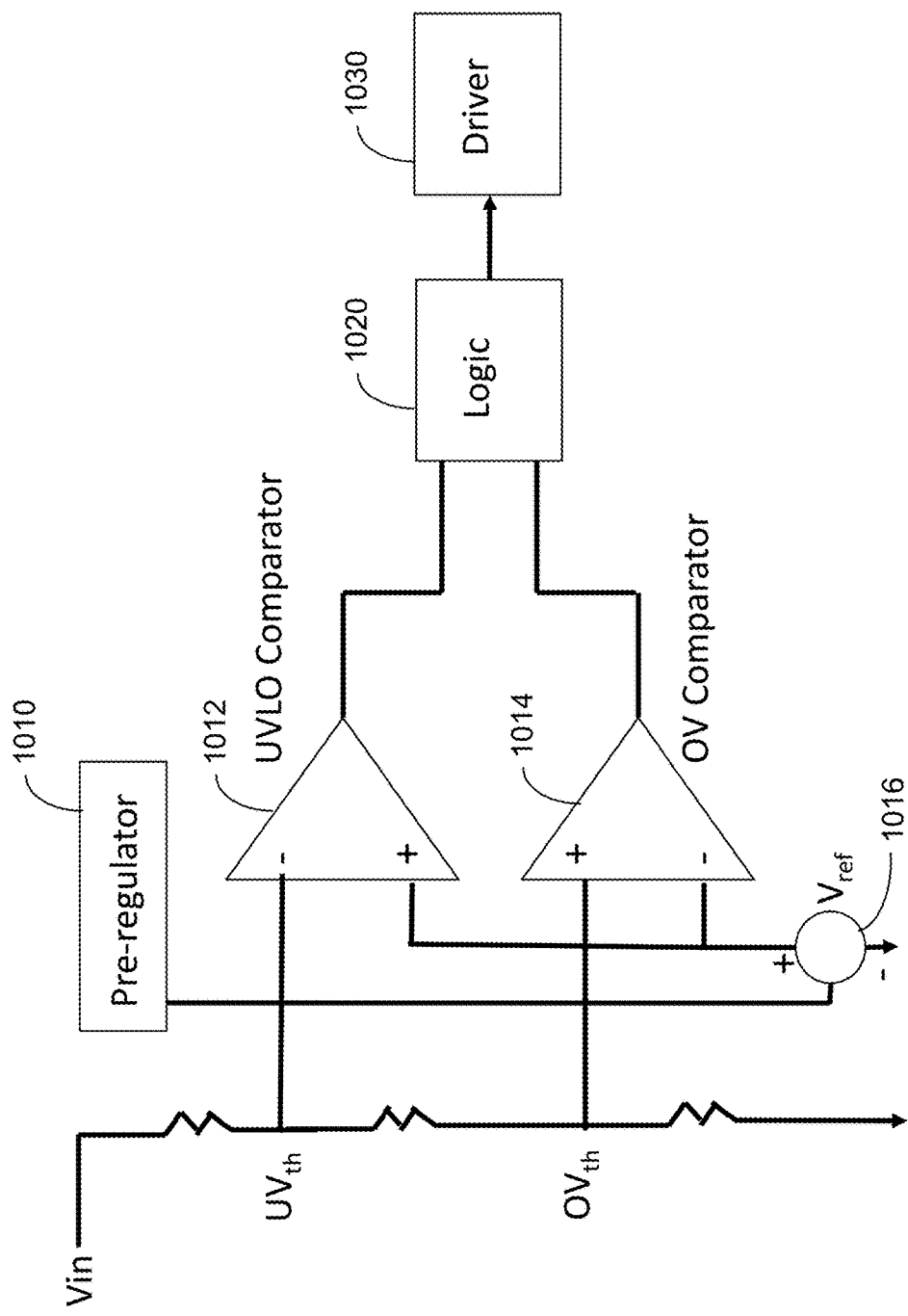
FIG. 10 shows overvoltage and undervoltage circuits used in the driver module in FIG. 9 in more detail.

FIG. 10 shows OV circuit 362 and UVLO circuit 366 used in the driver module in FIG. 9 in more detail. The input voltage Vin is connected to the negative input of the UVLO comparator 1012 and the positive input of the OV comparator 1014. The voltage reference (Vref) 1016 is connected to the positive input of the UVLO comparator 1012 and the negative input of the OV comparator 1014. A voltage pre-regulator 1010 is coupled to Vref 1016. The outputs of the UVLO comparator 1012 and the OV comparator 1014 are coupled to HEMT control logic block 1020 that controls a driver 1030. An external resistor divider allows the user to select an input supply range that is compatible with the load at the output.

Typically, when UV/OV protection is built into a HEMT/MOSFET controller chip, there is an access to these functions and the fault signal via external pins for the system designer. When the system power is first turned on, gate drive is at its maximum for all values of Vin. This is to prevent start-up problems by ensuring that there is enough gate drive to support the output load.

As Vout starts ramping up from 0V, the absolute value of the gate voltage remains fixed until Vout is greater than a certain threshold voltage. For example, in a typical portable product application using an external switch (MOSFET or HEMT) for a Vin of 12V nominal and say 3.3V to 18V output, this threshold may be 6V.

Once Vout crosses this threshold, gate drive begins to increase up to a certain maximum (say 9V). In other words, the gate drive is a function of both Vin and Vout. Once the UV or OV fault propagates through the UV/OV comparator ($t_{fault}$), the Fault output is asserted low, and a current sink (in the logic block 1020 in FIG. 10) discharges the gate of the HEMT (or a MOSFET), pulling it down.

As Vout falls, the gate tracks Vout. When both the UV and OV faults are removed, the switch (MOSFET or HEMT) is not immediately turned on. The input supply remains in a user selected power good range for a certain time (typically a few milliseconds) before the load is again connected to the supply. This recovery timeout period filters noise at the input and prevents chattering of power at the load.

Any of the devices in driver module 304 may be formed in GaN HEMT epi layers on a same engineered substrate and then interconnected together. As described above, any combination of the digital and/or analog logic devices in driver module 304 may be fabricated in different epi sections of HEMT device 450A on the same ES 110. Sophisticated digital logic circuits are difficult to realize even in the state of the art GaN technologies since complementary devices are not available as yet. However, as the technology advances, this issue will be resolved, further enabling CMOS-like integration. Thus, the direct power LED circuit 800 in FIG. 8 may be fabricated as one GaN integrated circuit.

Figure 11:
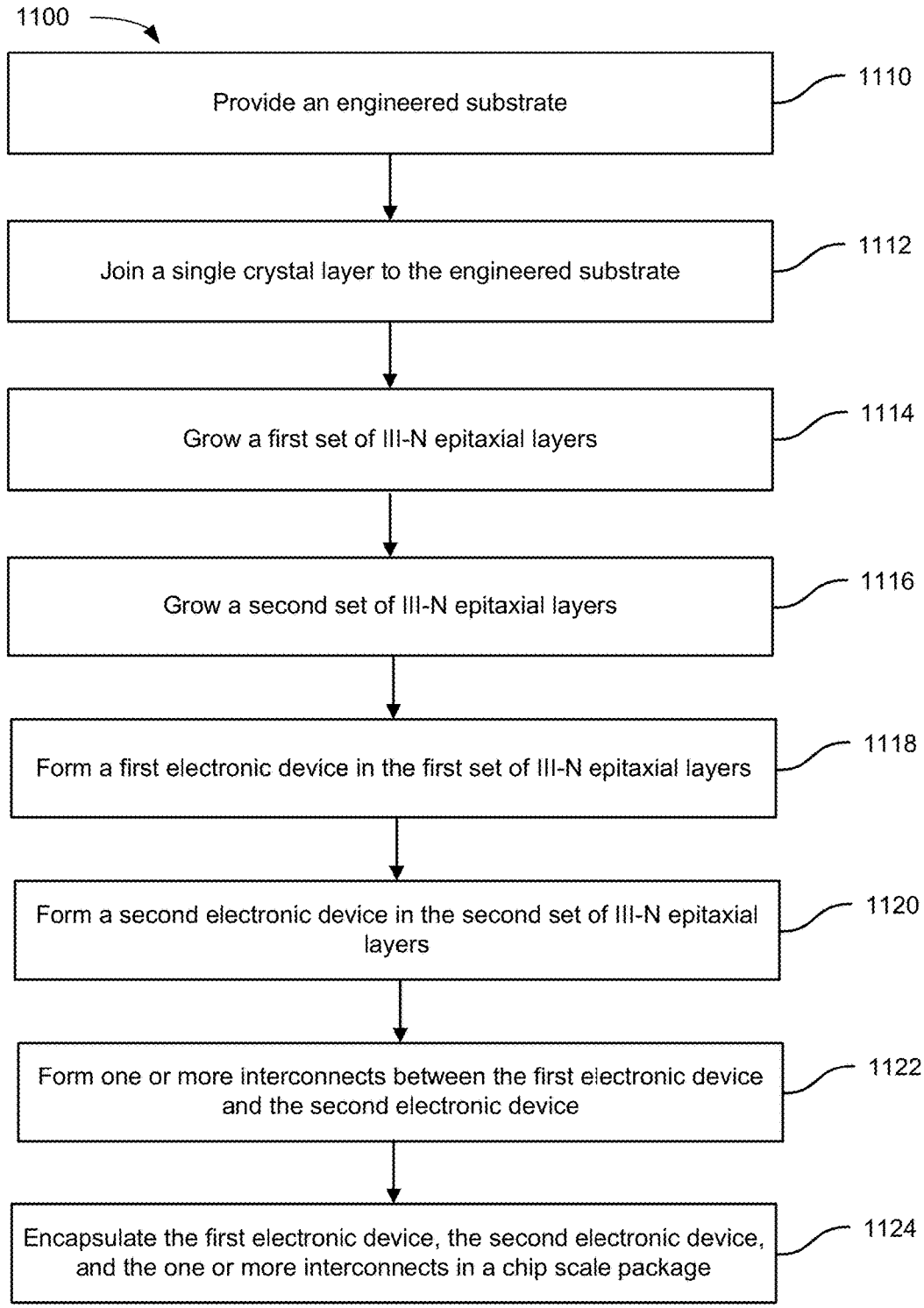
FIG. 11 is a simplified flowchart illustrating a method of fabricating a III-nitride integrated circuit according to an embodiment of the present invention.

FIG. 11 is a simplified flowchart illustrating a method of fabricating a III-nitride integrated circuit according to an embodiment of the present invention. The method 1100 includes providing a engineered substrate (1110) and joining a single crystal layer to the engineered substrate (1112). In some embodiments, providing the engineered substrate includes providing a polycrystalline ceramic core, encapsulating the polycrystalline ceramic core in a first tetraethyl orthosilicate (TEOS) layer, encapsulating the first TEOS layer in a polysilicon layer, encapsulating the polysilicon layer in a second TEOS layer, and encapsulating the second TEOS layer in a silicon nitride layer.

The method also includes growing a first set of III-N epitaxial layers (1114) coupled to the single crystal layer and growing a second set of III-N epitaxial layers (1116) coupled to the first set of III-N epitaxial layers. The first set of III-N epitaxial layers can include GaN materials and the second set of III-N epitaxial layers can include GaN materials similar or different from the first set of III-N epitaxial layers.

The method further includes forming a first electronic device disposed at least partially in the first set of III-N epitaxial layers (1118) and forming a second electronic device disposed at least partially in the second set of III-N epitaxial layers (1120). As described herein, the first electronic device and the second electronic device can include transistors, diodes, LEDs, lasers, photodetectors, and the like. Thus, the use of the term electronic device includes optoelectronic devices.

The method can also include forming one or more interconnects between the first electronic device and the second electronic device (1122). In some embodiments, the method includes forming one or more isolating III-N epitaxial layers disposed between the first set of III-N epitaxial layers and the second set of III-N epitaxial layers. In an alternative embodiment, the method includes forming one or more buffer layers between the single crystal layer and the first set of III-N epitaxial layers. The method also includes encapsulating the first electronic device, the second electronic device, and the one or more interconnects in a chip scale package (1124).

As illustrated in FIG. 7, the engineered substrate can be removed during the process of processing and/or packaging.

It should be appreciated that the specific steps illustrated in FIG. 11 provide a particular method of fabricating a III-nitride integrated circuit according to an embodiment of the present invention. Other sequences of steps may also be performed according to alternative embodiments. For example, alternative embodiments of the present invention may perform the steps outlined above in a different order. Moreover, the individual steps illustrated in FIG. 11 may include multiple sub-steps that may be performed in various sequences as appropriate to the individual step. Furthermore, additional steps may be added or removed depending on the particular applications. One of ordinary skill in the art would recognize many variations, modifications, and alternatives.

The specific details of the specific aspects of implementations disclosed herein may be combined in any suitable manner without departing from the spirit and scope of the disclosed implementations. However, other implementations may be directed to specific implementations relating to each individual aspect, or specific combinations of these individual aspects.

While some implementations have been described herein, it should be understood that they have been presented by way of example only, and not limitation. Thus, the breadth and scope of the present application should not be limited by any of the implementations described herein, but should be defined only in accordance with the following and later-submitted claims and their equivalents.

What is claimed is:

1. A method of fabricating a III-nitride integrated circuit, the method comprising:
    providing an engineered substrate comprising:
        a polycrystalline ceramic core;
        a barrier layer encapsulating the polycrystalline ceramic core; and
        a bonding layer coupled to the barrier layer;
    joining a single crystal layer to the bonding layer;
    growing a first set of III-N epitaxial layers coupled to the single crystal layer;
    growing a second set of III-N epitaxial layers coupled to the first set of III-N epitaxial layers;
    forming a first electronic device disposed at least partially in the first set of III-N epitaxial layers;
    forming a second electronic device disposed at least partially in the second set of III-N epitaxial layers;
    forming one or more interconnects between the first electronic device and the second electronic device; and
    encapsulating the first electronic device, the second electronic device, and the one or more interconnects in a chip scale package.

2. The method of claim 1 wherein the first set of III-N epitaxial layers comprise GaN and the second set of III-N epitaxial layers comprise GaN.

3. The method of claim 1 wherein the engineered substrate further comprises:
a first tetraethyl orthosilicate (TEOS) layer encapsulating the polycrystalline ceramic core;
a polysilicon layer encapsulating the first TEOS layer; and
a second TEOS layer encapsulating the polysilicon layer;
wherein the barrier layer comprises silicon nitride and encapsulates the second TEOS layer.

4. The method of claim 1 further comprising forming one or more isolating III-N epitaxial layers disposed between the first set of III-N epitaxial layers and the second set of III-N epitaxial layers.

5. The method of claim 1 further comprising forming one or more buffer layers between the single crystal layer and the first set of III-N epitaxial layers.

6. The method of claim 1 further comprising forming an emission structure including a transparent material and a phosphor, wherein the emission structure is adjacent the first electronic device and the second electronic device.

7. The method of claim 1 wherein the polycrystalline ceramic core comprises aluminum nitride.

8. The method of claim 1 wherein the single crystal layer comprises silicon.

9. The method of claim 1 wherein the engineered substrate further comprises:
a first adhesion layer encapsulating the polycrystalline ceramic core;
a conductive layer encapsulating the first adhesion layer; and
a second adhesion layer encapsulating the conductive layer;
wherein the barrier layer encapsulates the second adhesion layer.

10. A method of fabricating a III-nitride integrated circuit, the method comprising:
providing an engineered substrate comprising:
a polycrystalline ceramic core;
a barrier layer encapsulating the polycrystalline ceramic core; and
a bonding layer coupled to the barrier layer;
joining a single crystal layer to the bonding layer;
growing a first set of III-N epitaxial layers coupled to the single crystal layer;
growing a second set of III-N epitaxial layers coupled to the first set of III-N epitaxial layers;
forming a first electronic device disposed in the first set of III-N epitaxial layers;
forming a second electronic device disposed in the second set of III-N epitaxial layers; and
forming one or more interconnects between the first electronic device and the second electronic device.

11. The method of claim 10 further comprising encapsulating the first electronic device, the second electronic device, and the one or more interconnects in a chip scale package.

12. The method of claim 10 wherein:
the polycrystalline ceramic core comprises aluminum nitride;
the barrier layer comprises silicon nitride;
the bonding layer comprises silicon oxide; and
the single crystal layer comprises silicon.

13. The method of claim 10 wherein the first set of III-N epitaxial layers comprise GaN and the second set of III-N epitaxial layers comprise GaN.

14. The method of claim 10 wherein:
the first electronic device comprises at least one of a diode, a transistor, a unipolar device, or a bipolar device; and
the second electronic device comprises at least one of a diode, a transistor, a unipolar device, or a bipolar device.

* * * * *